(12) United States Patent
Behle et al.

(10) Patent No.: US 7,926,446 B2
(45) Date of Patent: Apr. 19, 2011

(54) MULTI-PLACE COATING APPARATUS AND PROCESS FOR PLASMA COATING

(75) Inventors: Stephan Behle, Hanheim (DE); Andreas Luttringhaus-Henkel, Darmstadt (DE); Gregor Arnold, Bodenheim (DE); Mathias Bicker, Mainz (DE); Marten Walther, Alfeld (DE); Juergen Klein, Mainz (DE)

(73) Assignee: Schott AG, Mainz (DE)

( * ) Notice: Subject to any disclaimer, the term of this patent is extended or adjusted under 35 U.S.C. 154(b) by 741 days.

(21) Appl. No.: 10/515,084

(22) PCT Filed: May 26, 2003

(86) PCT No.: PCT/EP03/05497
§ 371 (c)(1),
(2), (4) Date: Sep. 8, 2005

(87) PCT Pub. No.: WO03/100121
PCT Pub. Date: Dec. 4, 2003

(65) Prior Publication Data
US 2006/0150909 A1 Jul. 13, 2006

(30) Foreign Application Priority Data

| | | |
|---|---|---|
| May 24, 2002 | (DE) | 102 23 288 |
| Jun. 1, 2002 | (DE) | 102 24 395 |
| Jun. 7, 2002 | (DE) | 102 25 607 |
| Jun. 7, 2002 | (DE) | 102 25 609 |
| Nov. 16, 2002 | (DE) | 102 53 512 |
| Nov. 16, 2002 | (DE) | 102 53 513 |

(51) Int. Cl.
*C23C 16/511* (2006.01)
*C23F 1/00* (2006.01)
*H01L 21/306* (2006.01)
*C23C 16/06* (2006.01)
*C23C 16/22* (2006.01)

(52) U.S. Cl. .......... 118/723 MW; 118/719; 156/345.41; 156/345.31

(58) Field of Classification Search .......... 118/723 MW, 118/719; 156/345.41, 345.31
See application file for complete search history.

(56) References Cited

U.S. PATENT DOCUMENTS
2,875,415 A * 2/1959 Sferrazza ...................... 324/629
(Continued)

FOREIGN PATENT DOCUMENTS
JP 2003171771 6/2003
(Continued)

OTHER PUBLICATIONS
STIC certified translation of WO01-54164, Aug. 13, 2010.*
(Continued)

*Primary Examiner* — Rudy Zervigon
(74) *Attorney, Agent, or Firm* — Ohlandt, Greeley, Ruggiero & Perle, LLP

(57) ABSTRACT

A coating apparatus is provided for simplifying the introduction and removal of workpieces into and from a reactor for plasma coating and to increase the throughput. The coating apparatus has a reactor with a moveable sleeve part and a base element, at least one sealed coating chamber being defined between sleeve part and base element when the latter two parts are fitted onto one another. The coating apparatus also has a device for introducing electromagnetic energy into the at least one coating chamber. The reactor has at least two coating places.

20 Claims, 11 Drawing Sheets

U.S. PATENT DOCUMENTS

| | | | |
|---|---|---|---|
| 5,324,361 A | 6/1994 | Etzkorn et al. | 118/719 |
| 5,565,248 A * | 10/1996 | Plester et al. | 427/571 |
| 2003/0051666 A1 * | 3/2003 | Moore et al. | 118/723 MW |

FOREIGN PATENT DOCUMENTS

| | | |
|---|---|---|
| WO | WO 95/22413 | 8/1995 |
| WO | WO 99/17334 | 4/1999 |
| WO | WO 00/58631 | 10/2000 |
| WO | WO 01/31680 | 5/2001 |
| WO | WO 01/48788 A1 * | 7/2001 |
| WO | WO 0154164 A1 * | 7/2001 |

OTHER PUBLICATIONS

IPER from corresponding PCT/EP2003/005497 dated May 26, 2003.

* cited by examiner

MULTI-PLACE COATING APPARATUS AND PROCESS FOR PLASMA COATING

BACKGROUND OF THE INVENTION

1. Field of the Invention

The invention relates to a coating apparatus and to a process for the plasma coating of workpieces, in particular a coating apparatus having a plurality of coating places and a process for the simultaneous coating of a plurality of workpieces.

2. Description of Related Art

The barrier properties of plastic containers, such as for example plastic bottles can be improved considerably by barrier layers on the inner surface or outer surface of such containers. It is in this way possible, for example, to protect foodstuffs from the effects of oxygen, which is relatively good at diffusing through most types of plastics.

Coatings of this type can be deposited on the container walls, inter alia by means of various CVD processes (CVD: chemical vapor deposition). For this purpose, the plasma is generally ignited at a low pressure in a gas atmosphere which includes a precursor gas. The reaction products formed in the plasma are then deposited as a coating on the workpiece to be treated. The low-pressure atmosphere required to ignite the plasma needs the area surrounding the workpiece to be evacuated. This can be done, for example, by suitable lock means or also by the workpiece being introduced into the reactor space under standard pressure and the reactor space then being evacuated. The way in which the workpiece is transferred from a standard pressure atmosphere to a low-pressure atmosphere or a vacuum is accordingly a key problem with regard to the process speed and costs for a CVD coating.

WO 01/31680 A1 has disclosed an apparatus for the low-pressure plasma treatment of containers in which the treatment station includes a stationary cavity which can be closed and opened by means of a removable cover, the cover having a connecting passage which, in the closed state of the treatment station, produces a connection to a vacuum circuit. The containers which are to be coated are inserted into the stationary cavity and then the cover is closed, after which the cavity can be evacuated.

However, this design is disadvantageous in that the container which is to be coated has to be conveyed into the cavity along two mutually perpendicular directions, which involves a complicated movement. Moreover, when inside the cavity the container is surrounded on all sides, apart from the opening which is covered by the cover in the closed state, by the walls of the cavity and is therefore difficult to grip after coating has taken place in order to be conveyed onward. Furthermore, the throughput which can be achieved through an apparatus of this type is limited, since the sequence of movements has to be repeated for each individual container for each coating operation.

BRIEF SUMMARY OF THE INVENTION

Therefore, the invention is based on the object of providing a coating apparatus and a process which simplify the conveying of workpieces out of and into the coating reactor and allow a high throughput to be achieved.

Accordingly, a coating apparatus according to the invention, or a plasma station for the plasma coating of workpieces, comprises, a reactor or a plasma chamber with a moveable sleeve part and a base element, with at least one sealed coating chamber or cavity being defined or formed between sleeve part and base element in the position in which they are fitted together, and a device for introducing electromagnetic energy into the at least one coating chamber. Moreover, the reactor has at least two coating places. The result of this is that at least two workpieces can be supplied, coated and removed again simultaneously. The arrangement according to the invention with a moveable sleeve part facilitates the sequence of movements for insertion and removal of the workpieces.

The process according to the invention for the plasma coating of workpieces, which can be carried out in particular in an apparatus according to the invention having a reactor with a moveable sleeve part and a base element, accordingly provides for at least two workpieces which are to be coated to be arranged on the base element, the sleeve part to be fitted together with the base element through movement of the sleeve part, so that in the fitted-together position at least one sealed coating chamber is defined or formed between sleeve part and base element, in which coating chamber at least one of the workpieces is located, the coating chamber to be evacuated, process gas to be introduced, and a plasma to be generated by the introduction of electromagnetic energy.

On account of the fact that the coating operation is carried out for two or more workpieces simultaneously, the throughput can be increased by a corresponding factor by the apparatus. Since the sleeve part is designed to be moveable with respect to a stationary base element, the coating places for the workpieces are readily accessible. On account of the moveable sleeve part, the workpieces do not have to be introduced into the sleeve part, but rather can simply be arranged at or on the base element, with the sleeve part then being fitted over the workpieces during the closing movement.

Moreover, the invention allows a coating apparatus with low moving masses to be designed, since only the sleeve part has to be moved.

To open and close the coating chamber, the sleeve part can advantageously be moved substantially perpendicular to the base element by means of a corresponding guidance of the sleeve part in order to make the coating places as freely accessible as possible.

According to one embodiment of the invention, the base element is in the form of a base plate.

Moreover, it is particularly advantageous if the base element has supply passages through which operating media are comprises in particular the evacuation and/or venting and/or supplying of process gas through the supply passages. Since the base element remains stationary with respect to the coating apparatus when the reactor is being opened and closed, it is in this way possible to virtually avoid dynamic or moving vacuum connections, such as for example corrugated hoses, and moving seals. In particular this arrangement allows a robust, low-maintenance design with few moving parts. Moreover, it is in this way possible for valves which are used to control and switch the incoming flows of gases and for discharge purposes, to be arranged directly on or in the vicinity of the base element and in the vicinity of the coating chambers. The result is a low dead volume.

According to a first embodiment, at least two separate coating chambers are defined between sleeve part and base element. The use of separate coating chambers means that the plasmas ignited in the individual coating places cannot influence and interfere with one another.

However, according to a further embodiment of the invention, it is also possible to provide a common coating chamber for at least two coating places. This may be advantageous, for example, if the workpieces are coated in a common plasma.

The device for introducing electromagnetic energy preferably has at least one supply conductor which passes the electromagnetic fields into the coating chamber. This supply conductor may, for example, engage in an opening in the sleeve part. To seal the opening, the edge of the latter and/or the conductor, for example at a sealing collar, may be provided with a seal.

Microwaves or radio-frequency fields are generally used to transported, the at least one supply conductor preferably comprises a waveguide and/or a coaxial conductor.

To open and close the coating chamber, the sleeve part may advantageously be configured such that it can move along the supply conductor(s), or for the opening and closing can be moved along the supply conductor for supplying electromagnetic energy. In this way, the supply conductor can simultaneously serve as a guide for the sleeve part.

Furthermore, the device for introducing electromagnetic energy may preferably, moreover, comprise at least one device for generating electromagnetic energy. The fields used to generate the plasma are therefore generated directly in the coating apparatus, and consequently there is no need for microwaves or radio-frequency waves to be supplied, which under certain circumstances would have to be effected by means of flexible conductors which are difficult to handle. This is advantageous in particular if the coating apparatus is moved on a conveyor device of a coating installation or of a plasma module.

It is preferable for the introduction of electromagnetic energy to comprise the introduction of microwaves in order to allow large quantities of energy to be introduced into the plasma. For this purpose, the device for generating electromagnetic energy may advantageously comprise at least one microwave head. The latter may, for example, have a magnetron as microwave source. A frequency of 2.45 GHz is particularly suitable for the microwaves generated by the microwave head.

Moreover, the device for introducing electromagnetic energy may advantageously also comprise a device for distributing the electromagnetic energy, for example in the form of a waveguide or impedance structure. The energy generated by a source can be distributed to a plurality of coating places or coating chambers using a device of this type. A device of this type may, for example, comprise a waveguide or impedance structure as described in the earlier German patent application bearing the application number 101 38 693.1-52, the content of disclosure of which is hereby incorporated in full by reference in the subject matter of the present application.

In a preferred embodiment of the invention, a pulsed plasma is generated by the supply of pulsed electromagnetic energy. Accordingly, in this embodiment of the invention, the device for generating electromagnetic energy comprises a device for generating pulsed electromagnetic energy. A pulsed plasma for applying the pulse induced CVD or PICVD process (PICVD=pulse induced chemical vapor deposition) as coating process is generated by means of pulsed electromagnetic energy. The PICVD process is therefore advantageous compared to plasma-enhanced chemical vapor deposition (PECVD), in which the plasma is maintained continuously, inter alia because this process allows the heating of the temperature-sensitive plastics to be reduced. Moreover, gas exchange is possible during the times outside the pulses, in which no plasma is excited. This leads to particularly pure layers, since undesired reaction products can be discharged in the intervals between pulses and new precursor gas can be supplied.

One main application of the apparatus according to the invention is for the coating of workpieces which are in the form of hollow bodies, for which purpose the coating places may advantageously be designed to receive workpieces of this type. The coating places may in particular be designed to receive bottles, ampoules, spherical caps or light bulb bodies. However, coating of solid bodies, such as for example solid plastic moldings, is also possible using the coating apparatus.

One embodiment of the invention provides for the evacuation of the coating chamber to be carried out in steps in at least two pressure stages. This has proven expedient for a rapid evacuation operation, since it makes the evacuation in the individual pressure stages more efficient.

The apparatus according to the invention may in particular also be designed for the internal coating of workpieces which are in the form of hollow bodies. Accordingly, following the evacuation, process gas is introduced into the interior, so that when electromagnetic energy is supplied or radiated in, a plasma is ignited there and a coating is deposited on the inner walls of the workpieces. In this context, it is also advantageous if the coating places have seals for sealing off the interior of the workpieces in the form of hollow bodies. Sealing off the interior from the area surrounding the hollow bodies creates the option of providing different atmospheres and/or pressures in the interior of the workpieces and the area surrounding them. By way of example, the area surrounding the workpiece and the interior of the workpiece can be evacuated simultaneously, the interior being evacuated down to a base pressure, typically <0.1 mbar, in particular in the range from 0.05 to 0.8 mbar, and the area surrounding the workpiece being evacuated either i) likewise to below the base pressure or ii) to a fixed external pressure in the range from 1 to 100 mbar, in particular in the range from 10 to 100 mbar.

Then, by way of example, process gas can be introduced into the interior. For purely internal coating, accordingly, process gas is supplied only to the interior. In this way it is possible, for example, to generate a plasma selectively only in the interior, since the gas density in the surrounding area is insufficient to form a plasma.

To enable separately controllable atmospheric conditions of this type to be created, it is advantageous if, for example, the base element has separate supply passages for evacuating and/or venting and/or supplying process gas for the interior of and the area surrounding the workpieces in the form of hollow bodies. By way of example, it is also possible for the supply passages of two or more coating places to be connected to one another via common further supply passages or supply lines. This reduces the effective overall length and wall surface area of the supply passages and thereby increases the pumping power and the gas flow.

It is also expedient for the gas flow, in this case specifically for the flow of process gas, if process gas is supplied or introduced into a coating chamber via at least one gas lance. The gas lance may be arranged in such a way that its one or more openings are located in the plasma. In this way, the transport paths for the precursor gas in the plasma are kept short, so that it is distributed as uniformly as possible within the shortest possible time.

The gas lance may be designed such that it can be moved in and out. This is useful, for example, for internal coatings of hollow bodies, when the gas lance projects into the interior of the workpiece in the form of a hollow body, and would therefore constitute an obstacle during introduction or removal of the workpiece. In this case, the gas lance can be withdrawn from the interior of the workpiece prior to the latter being removed and can then be introduced into a further workpiece again after the latter has been inserted.

The movement of the gas lance and in particular also of the sleeve part can be imparted in a particularly simple way by means of mechanical control cams. These cams may be arranged at a coating installation and, by way of example, can impart the movement of sleeve part and/or gas lance via cam rollers arranged thereon. Moreover, the control of the opening and closing operation of a coating reactor with mechanical control cams, as well as further design details, are described extensively in the German application bearing application number 102 28 898.4, the content of disclosure of which is hereby incorporated in full by reference in the subject matter of the present application.

An economical coating process requires high-performance installations. To achieve a high performance in an installation of this type, it is particularly expedient if the coating region of the coating chamber can be evacuated to the required or desired final pressure as quickly as possible. For this purpose, it is expedient if the feed lines to the coating chamber have good conductances.

Furthermore, it is expedient if the feed lines to the coating chamber produce only small volumes which additionally have to be evacuated. Therefore, it is within the scope of the invention to provide a process and an apparatus which allow an increased throughput.

For this purpose, the invention provides a coating installation for the vacuum coating of workpieces, which comprises a conveyor device, and at least one coating apparatus arranged on the conveyor device, the coating apparatus being connected to at least two feed lines via a valve block.

According to a refinement of the invention, the valves can be switched or actuated in a freely selectable way. The compact arrangement of the valves in or on a valve block reduces the length of the supply passages required and therefore the volume which has to be evacuated. Moreover, it is easy to exchange wearing parts.

It is particularly preferable for the valve block, like the coating apparatus, to be arranged on the conveyor device. This makes it possible to avoid moving couplings, which are expensive and have an adverse effect on the conductance and the leak rate.

A suitable coating apparatus in this context is in particular a coating apparatus according to the invention as described above, which comprises a reactor having a moving sleeve part and a base element, as well as a device for introducing electromagnetic energy into the at least one coating chamber, with the reactor also having at least two coating places.

Of course, it is also possible for coating apparatuses of other designs to be used for a coating installation according to the invention.

Accordingly, a corresponding process for plasma coating comprises the steps of positioning at least one workpiece which is to be coated at a coating place of a reactor of a coating station or coating apparatus which is arranged on a conveyor device of a coating installation, evacuating the area surrounding a surface of the workpiece which is to be coated, supplying process gas, and generating a plasma by the introduction of electromagnetic energy, at least one of the steps of evacuating or supplying process gas being controlled by switching valves of a valve block which is arranged on the conveyor device.

The plasma is in this case generated in particular in the area surrounding the surface of the workpiece which is to be coated, with the process gas being fed to the area surrounding the surface.

According to one embodiment of the invention, a suitable coating installation in general has a coating apparatus with a reactor which comprises at least two chamber parts, at least one of which parts is moveable, with a sealed coating chamber being formed between the chamber parts in the position in which the parts have been fitted together. The workpiece is in this case first of all positioned at the intended coating place and then the parts are fitted together to form at least one coating chamber.

As in the embodiments described above, it is preferable for the coating apparatus to have at least two coating chambers in order to achieve an increased throughput and to improve the economics of the coating installation.

In an embodiment of the invention of this type, it is expedient if the valve block has at least one valve and/or a valve seat and each of the chambers is connected to the valve block via at least one supply passage with the valve or the valve seat.

The supply passages may in this case advantageously be arranged symmetrically with respect to the valve or the valve seat, in order for the chambers to be supplied uniformly and in this way, for example, to achieve equal pressures in the chambers.

In an embodiment of the invention in which the coating apparatus has a plurality of coating chambers, a valve block in which supply passages for the chambers are assigned to at least one common valve of the valve block, is also particularly advantageous. This reduces the number of valves required and as a result also results in better conductances.

Accordingly, in a process for coating workpieces using a coating installation having a coating apparatus which has a plurality of coating chambers, it is advantageously possible for at least one of the steps of evacuating the area surrounding a surface of the workpieces which is to be coated in the coating chambers or of supplying process gas to the coating chambers to be realized via at least one common valve of the valve block.

According to a refinement of the invention, at least one of the feed lines produces a connection to at least one pump device, in order for the coating chambers or the area surrounding the surface or surfaces of the workpieces which is/are to be coated to be evacuated and/or for process gas to be pumped out.

Moreover, an advantageous refinement of the invention provides for the coating apparatus, as in the case of the coating apparatus according to the invention described above, to comprise a base element and a sleeve part which can move with respect to this base element, with at least one coating chamber being formed between these fitted-together parts. In this embodiment, it is particularly advantageous if supply lines or supply passages between the valve block and the coating chamber are routed through the base element to the coating chamber. This arrangement makes It possible to avoid moving lines or seals between the valve block and the coating chamber. According to a variant of this embodiment, the valve block even forms a constituent part of the base element or of a rigid part of the reactor, i.e. a part of the reactor which does not move for opening and closing of the chamber. This allows the lengths of the supply lines to be reduced to a minimum.

Moreover, according to a further embodiment of the invention, it is provided that the valve block has pneumatically or electromagnetically switched valves.

A pneumatic distribution device may advantageously be arranged on or integrated in the valve block, so that, for example for pneumatically switched valves, only a single compressed-air feed line is required.

The opening and closing of the pneumatically actuable valves can be controlled in particular by the pneumatic distribution device.

By suitable arrangement of the feed lines to the valve block, the valves of the valve block can advantageously be assigned to different operating media, such as for example pressure sources; the term operating media or pressure sources is to be understood in particular as meaning reduced-pressure sources, such as for example suitable pump devices, excess-pressure sources, standard or ambient pressure sources and gas sources, for example a process gas source. By switching the valves, it is then possible for these pressure sources, for example, to be sequentially connected to the coating chamber and thereby switched on and off. These pressure sources may, inter alia, comprise ambient pressure, various levels of reduced pressure, and supply and extraction devices for process gas.

The coating of workpieces in the form of hollow bodies, such as for example, bottles is preferred. In this context, it is advantageous if there are separate supply passages for the interior of and the area surrounding such workpieces, the supply passages being connected to at least one valve or valve seat of the valve block. For example, the interior of and the area surrounding the workpiece can be evacuated via separate supply passages. This is advantageous inter alia if only the inside is to be coated. In this case, the area surrounding the workpiece only needs to be evacuated to a sufficient extent for the pressure difference between the interior and the surrounding area not to cause deformation of the workpieces.

Furthermore the valve block can be designed in such a way that it comprises at least part of a supply passage in which a gas lance can be received. This supply passage may be provided in particular for the purpose of supplying the interior of workpieces in the form of hollow bodies. For the purpose of internal coating, the interior of the workpiece can be evacuated, the lance can be introduced into the interior and process gas can be supplied through the lance.

To avoid expensive and vulnerable dynamic seals, a coating installation in accordance with one embodiment of the invention may have at least one pump device arranged on the conveyor device. This allows the evacuation to be carried out at least partially using at least one such pump device arranged on the conveyor device, with the avoidance of moving seals.

According to yet another embodiment of the invention, consideration is given in particular to the coating apparatus being conveyed on a circular path on the conveyor device. Accordingly, the conveyor device of a coating installation according to the invention may comprise a rotor, for example a coating carousel or a plasma wheel. When the installation is operating, therefore, the coating apparatus rotates on the rotor, so that different circle sectors correspond to different process phases. This allows the installation to be a particularly simple structure and also allows a simple process sequence. In particular, it is also possible for a plurality of coating apparatuses which, by way of example, each comprise a coating apparatus according to the invention as described above, to be arranged on the rotor.

BRIEF DESCRIPTION OF THE SEVERAL VIEWS OF THE DRAWINGS

In the text which follows, the invention is described in more detail on the basis of preferred embodiments and with reference to the appended drawings, in which identical reference numerals denote identical or similar parts. In the drawings.

DETAILED DESCRIPTION OF THE INVENTION

Figure 1A:
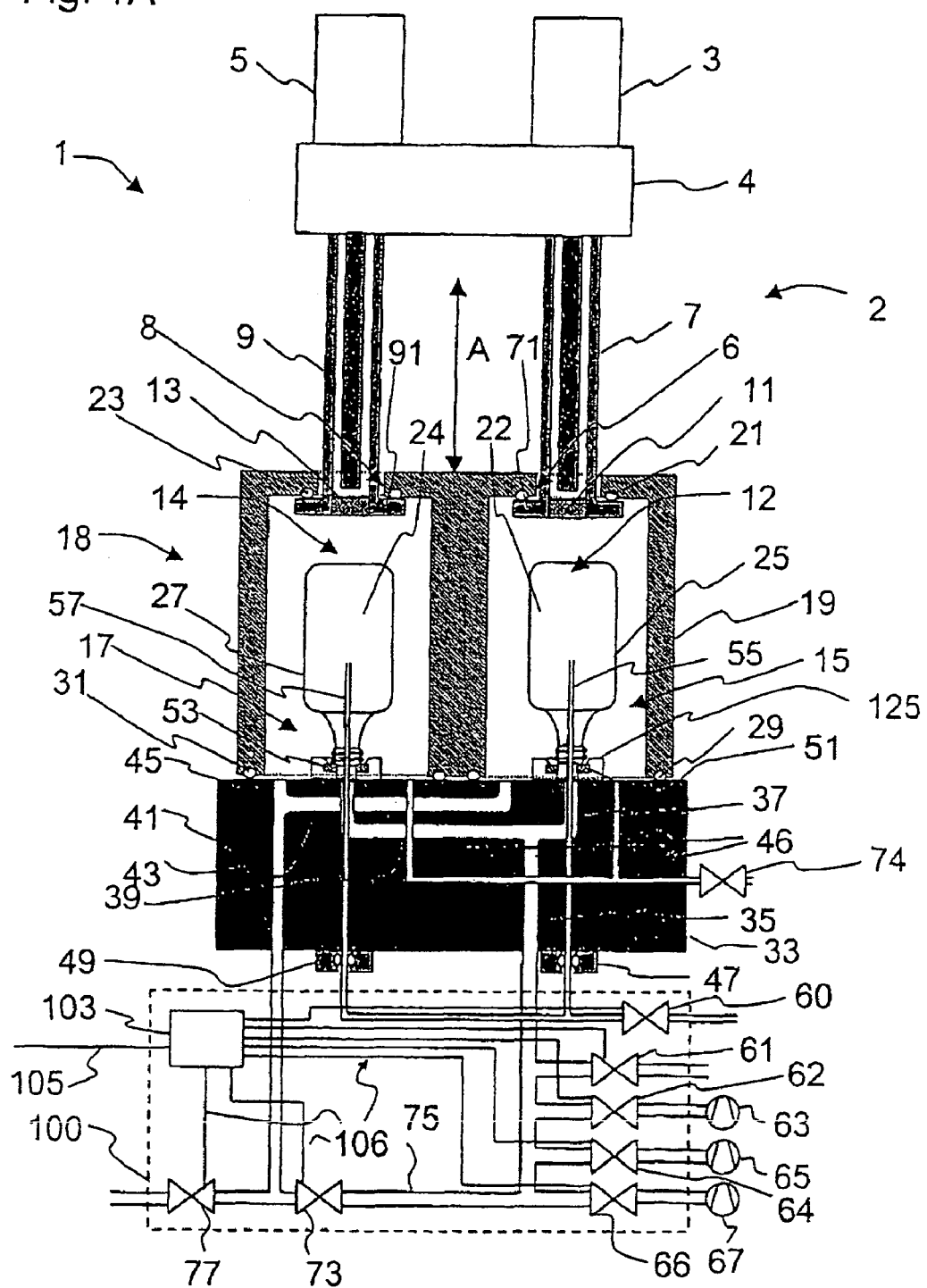
FIG. 1A shows a cross section through an embodiment of the invention.

FIG. 1A shows a diagrammatic cross-sectional view through an embodiment of the coating apparatus according to the invention, which is denoted overall by reference numeral 1. The coating apparatus 1 comprises a reactor 18 having a base element 33, which in the present exemplary embodiment is in the form of a base plate, and a moveable sleeve part 19, as well as a device 2 for introducing electromagnetic energy. The moveable sleeve part 19 may, for example, be in the form of a cylindrical chamber wall.

In the fitted-together position, as illustrated in FIG. 1, two sealed coating chambers 15, 17, which each constitute a first coating place 12 or a second coating place 14, respectively, for a workpiece and into which electromagnetic energy is introduced in order to ignite the plasma for coating, are formed between sleeve part 19 and base element 33. Accordingly, in the embodiment shown in FIG. 1, two workpieces can be treated simultaneously. Separating the chambers prevents the plasmas from affecting one another during the coating operation. The coating chambers 15, 17 of the reactor 2 are sealed off from the environment by third and fourth seals 29 and 31 which are arranged between base element 33 and sleeve part 19.

To coat workpieces 25 and 27, the workpieces are arranged on the base element 33, then the sleeve part 19 is brought together with the base element 33 by moving the sleeve part 19, so that in the fitted-together position of the two parts sealed coating chambers 15, 17, in which the workpieces 25, 27 are located, are defined between sleeve part 19 and base element 33. The coating chambers 15, 17 are then evacuated, process gas is introduced, and finally a plasma is generated by the introduction of electromagnetic energy, so that a CVD coating is formed on those surfaces of the workpieces which adjoin the plasma.

The device 2 for introducing electromagnetic energy also comprises a device for generating electromagnetic energy from two microwave heads or microwave generators 3 and 5, an adaptor in the form of a rectangular waveguide 4 and two feed lines or coupling channels, namely first and second supply conductors 7 and 9 which branch off from the rectangular waveguide and in the embodiment illustrated in FIG. 1 are in the form of coaxial conductors. The microwave heads preferably generate microwaves at the post office-approved frequency 2.45 GHz.

Figure 1B:
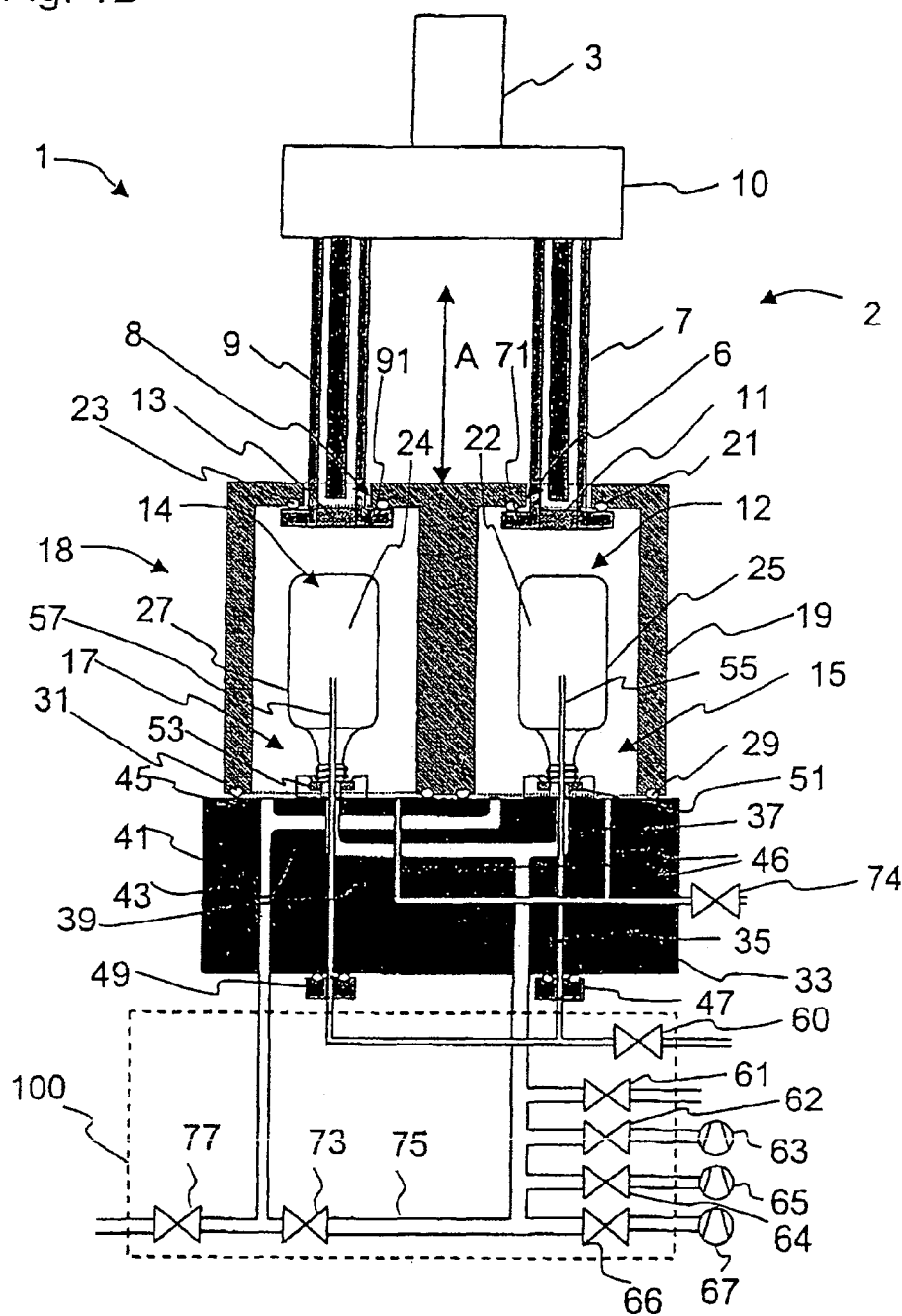
FIG. 1B shows a variant of the embodiment shown in FIG. 1A with a single microwave head for supplying the coating chambers together.

A variant of the embodiment illustrated in FIG. 1A is shown in FIG. 1B. This variant has only a single microwave head 3. In this case, both coating chambers 15, 17 are connected to the single microwave head. The microwave energy is then distributed between the individual coating chambers 15, 17 by means of an impedance structure or waveguide structure 10, as described, for example, in the German patent application bearing the application number 101 38 693.1-52.

In the embodiments illustrated in FIGS. 1A and 1B, for the coating chamber to be opened and closed, the sleeve part 19 is moved substantially perpendicular to the base element 33, in the direction indicated by A. Direction A in this case runs along the first and second supply conductors 7 and 9, so that the sleeve part can move along the supply conductors. The conductors in this case simultaneously serve as a guide for the sleeve part. To open and close the coating chambers 15, 17, the sleeve part 19 is moved accordingly, whereas the base element 33 remains in a fixed position.

Furthermore, the sleeve part 19 has openings 6 and 8 in which the first and second supply conductors 7 and 9 of the device 2 for introducing electromagnetic energy engage. The first and second coaxial conductors or supply conductors 7 and 9 are provided with a first sealing collar 71 and a second sealing collar 91, which when the coating chambers 15, 17 are being closed are pressed onto first and second seals 21 and 23 which are arranged on the sleeve part 19 and thereby close the coating chambers 15 and 17 in a vacuum-tight manner. Moreover, the first and second supply conductors 7, 9 are provided with dielectric windows 11 and 13, for example quartz glass windows for the microwaves to be introduced into the low-pressure or vacuum range of the reactor 18.

The embodiments shown in FIGS. 1A and 1B are specifically designed for the coating of workpieces 25 and 27 which are in the form of hollow bodies; in FIGS. 1A and 1B, bottles are illustrated as suitable examples of the workpieces. The base element 33 has sealing flanges 125 with seals 51 and 53 which, at the mouth opening of the workpieces, seal off the interior of the workpieces 25 and 27 in the form of hollow bodies in a vacuum-tight manner with respect to the surrounding area. This allows different pressures to be set inside and outside the workpiece, for example in order to allow purely internal coating or also purely external coating to be produced or to allow different coatings to be produced in the interior and on the outer surface of the workpieces 25, 27.

Figure 10A:
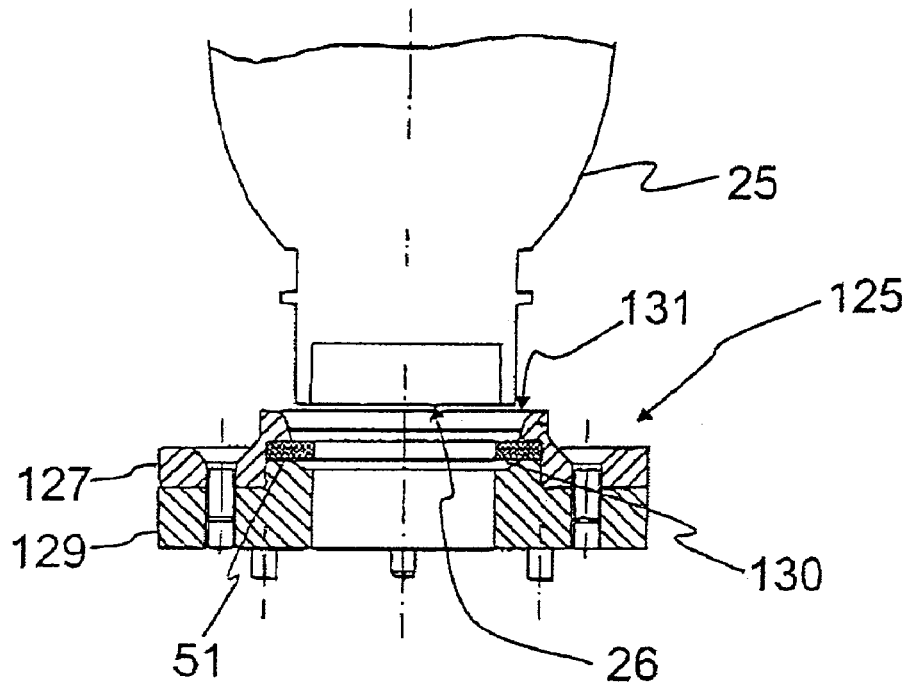
Figure 10B:
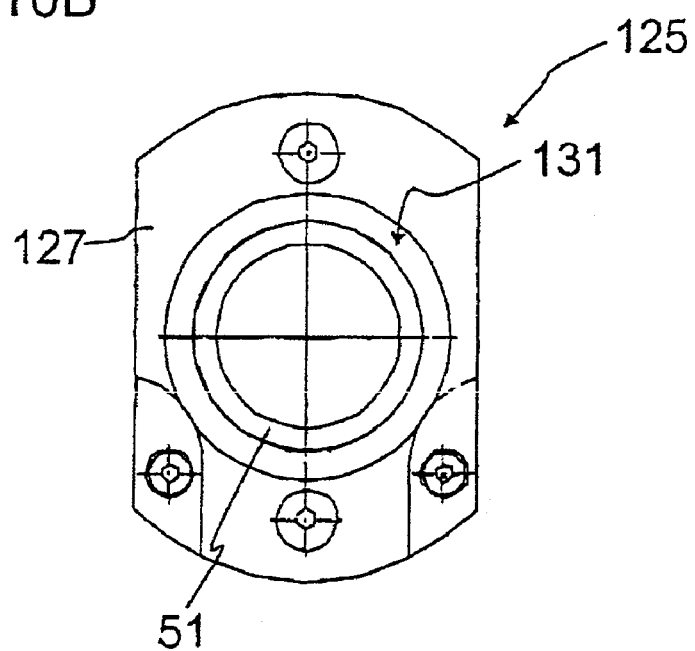

FIGS. 10A and 10B show a sectional illustration and a plan view of a sealing flange for sealing the mouth opening of a workpiece. The sealing flange has a first part 127 and a second part 129, which are screwed together. The seal 51 is clamped between these two parts 127, 129 as a result of them being screwed together and is thereby fixed in place. Part 129 of the sealing flange is secured to the base 33 of a coating apparatus 1 according to the invention. Part 127 has an insertion opening 131 which widens in the direction opposite to the insertion direction of the workpiece 25, in order to facilitate introduction of the workpiece. The internal diameter of the insertion opening 131 is smaller than the internal diameter of the seal 51. When the workpiece 25, such as in particular a bottle, is being inserted, therefore, mouth opening 26 of the workpiece comes into contact with the seal 51. As a result of the workpiece 25 being pressed onto the seal 51 or onto the sealing flange 125, the interior is sealed off with respect to the area surrounding the workpiece 25.

In many cases, a typical workpiece to be coated, such as for example a plastic drinks bottle, does not have a particularly planar mouth opening. This can lead to leaks if the seal is insufficiently flexible. To improve the flexibility of the seal 51, the part 129 for this purpose has an undercut 130 in the form of an annular depression running around the inner edge of the part 129. The seal 51 can yield in this region and thereby match the shape of the mouth opening of the workpiece 25.

Supply passages 46 which open out into the coating chambers 15, 17 of the first and second coating places 12, 14 and are connected to a gas supply (not shown) via a valve 74, can be provided for the purpose of supplying the area surrounding the workpieces in the coating chambers with process gas for external coating. Then, after the coating chambers 15, 17 have been evacuated, process gas can also be fed to the area surrounding the workpieces via the passages 46 and an external coating can also be realized by igniting a plasma in this region.

To enable the coating chambers 15, 17 to be evacuated and vented, supply passages 35, 37, 39, 41, 43 and 45 are provided in the base element, the supply passages 43 and 45 serving as chamber connection passages and the supply passages 35, 37 serving as workpiece connection passages. Dynamic seals or moving feed lines are avoided by the supply passages being arranged in the stationary part of the reactor, specifically the base element 33. The supply passages 35, 37, 39, 41, 43 and 45 can in this case serve both as evacuation passages for evacuation and discharging of process gas, and as vent passages for venting the coating chambers before the workpieces are removed.

To enable different pressures or gas atmospheres to be produced in the interior of and the area surrounding the workpieces, the base element has separate supply passages for evacuation and venting for the interior 22, 24 of the workpieces, on the one hand, and the area surrounding the workpieces 25, 27 in the form of hollow bodies, on the other hand. Specifically, the supply passages 43 and 45 serve to evacuate and vent the area surrounding the workpiece 15, 17 and the supply passages 37, 39 serve to evacuate and vent the interior 22, 24 of the workpieces 15, 17.

Furthermore, the supply passages 43, 45 for the are a surrounding the workpieces and the supply passages 37, 39 for the interior of the workpieces for both coating places are in each case connected to one another and open out into a common supply passage 41 for the area surrounding the workpieces and a supply passage 35 for the interiors 22, 24 of the workpieces. The process gas for the internal coating of the workpieces 25, 27 is supplied via hollow gas lances 55 and 57 which project into the interior of the workpieces during the coating operation. In the embodiment illustrated in FIG. 1A, these gas lances are sealed off from the environment of the coating apparatus 1 by means of dynamic seals 47 and 49 arranged on the base element 33. The flow of process gas is switched on and off by a process gas valve 60. The valve 60 can also be designed as a control valve for continuously controlling the process gas flow.

As an alternative to what is illustrated in FIGS. 1A and 1B, the coating apparatus 1 and/or the valve block 100 may also have a plurality of process gas valves, for example a primary process gas valve and a secondary process gas valve. Different process gases can then be admitted or individual process gas components supplied through the individual valves, in order to allow the composition of the coating which is deposited to be adapted. In this way, it is advantageously possible, for example, to deposit multilayer coatings with individual layers of different compositions on the workpieces. It may, inter alia, be advantageous first of all to apply a bonding layer and then a barrier layer, in prevent it from becoming detached.

In the embodiment of the apparatus according to the invention illustrated in FIG. 1B, the seals 47, 49 are secured to the gas lances 55, 57 and the sealing rings of the seals 47, 49 are arranged axially, so that the gas lance does not rub against the sealing ring when it is being moved in and out.

Accordingly, in this case there is no dynamic sealing, but rather the sealing ring forms a seal, as the gas lance is introduced when pressure is exerted on it in the extended position of the gas lances.

Moreover, pump devices 63, 65 and 67 are connected, via valves 62, 64 and 66, to the feed passage 35 for evacuating the interiors 22, 24 of the workpieces 25, 27. The pump device 63 serves to discharge process gas, and the valve 62 correspondingly serves as a process vacuum valve. The valves 64 and 66 serve as secondary and primary vacuum valves which are opened and closed sequentially in order to evacuate the coating chambers and/or the interiors of the workpieces in the form of hollow bodies, in order to realize evacuation in several pressure stages. The pump devices 65 and 67 are intended for evacuation to the residual gas pressure required for coating, it being possible for the pump devices to reach different end pressures and to be successively switched on and off for evacuation and discharging of process gas, so that a multistage pump system is created. Of course, however, it is also possible to use single-stage pump systems or systems with even more stages. The first pump stage, using the pump device 67, can advantageously be designed for evacuation from atmospheric pressure down to approximately 50 mbar. This can be followed, as a further pump stage by means of the pump device 65, by evacuation from the pressure reached by the first pump stage to the base pressure, which is typically in a range between 0.05 and 0.8 mbar. Alternatively, in particular if only internal coating of the workpieces is to be carried out, the interior 22, 24 of the workpieces 15, 17 can be evacuated to a base pressure of <0.1 mbar and the area surrounding the workpieces 15, 17 can be evacuated to a fixed external pressure of between 1 and 100 mbar. This means that the base pressure does not have to be reached on the outside. Consequently, inter alia it is possible to shorten the pumping time by reducing the pumped volume after the external pressure level has been reached, since from this point on only the interior has to be evacuated further. The evacuation from the preliminary vacuum in the range from 10 mbar to 100 mbar down to the base pressure may advantageously also, in accordance with a further exemplary embodiment, be carried out using further pump devices and valves (not shown in FIGS. 1A and 1B) in narrower steps or pressure stages.

Finally, process gas which flows in is pumped out by a third pump stage using the pump device 63, resulting in the process gas being exchanged and the pressure in the coating chambers being stabilized.

Furthermore, the supply passage 41 is connected to the supply passage 35 via a bypass line 75 which is switched by a valve 73 serving as a chamber vacuum valve. The areas surrounding the workpieces in the coating chambers 15, 17 can also be evacuated in this way. For this purpose, during the evacuation operation, the bypass line 75 is opened by means of the valve 73, so that the pump devices 65 and 67 are connected to the supply passages 43 and 45 via this line. After the evacuation has been concluded, the valves 73, 66 and 64 are then closed and process gas, after the valve 60 has been opened, flows via the lances 55, 57 into the interiors of the workpieces, and after the process vacuum valve 62 has been opened is continuously pumped out by the pump device 63. Furthermore, after the plasma has been ignited, fresh gas constantly flows in via the gas lances 55 and 57 and/or the passages 46, and consumed gas and residues of unconsumed process gas are pumped out by the pump device 63 via the opened valve 62.

After coating has finished, it is then possible, by opening the valves 61 and 77, to vent both the interiors and the surrounding coating chambers 15, 17. Standard pressure then prevails in the coating chambers and the workpieces, and the reactor can be opened without the need for much force. Valve 61 serves as workpiece vent valve and valve 77 serves as chamber vent valve.

According to an advantageous refinement of the invention, the valves 60, 61, 62, 64, 66, 73, 74, 77 are combined in a valve block 100 which, like the coating apparatus 1, is arranged on a conveyor device (not shown in FIGS. 1A and 1B) of a coating installation. Via the valve block 100, the coating chambers 15, 17 of the coating apparatus 1 are connected to the feed lines to the pump devices 63, 65, 67, and via the valve 650 to a process gas source, and via the valve 77 to venting with ambient pressure.

According to a refinement of the invention, the valve block 100 furthermore has a pneumatic distribution device 103 as diagrammatically depicted in FIG. 1A. This device distributes compressed air from a compressed-air feed line 105 via distribution lines 106 to the individual valves. The exemplary embodiments explained in FIG. 1B and the following figures may also have a pneumatic distribution device 103 of this type, but such a device is not shown in those figures for the sake of simplicity.

Figure 2:
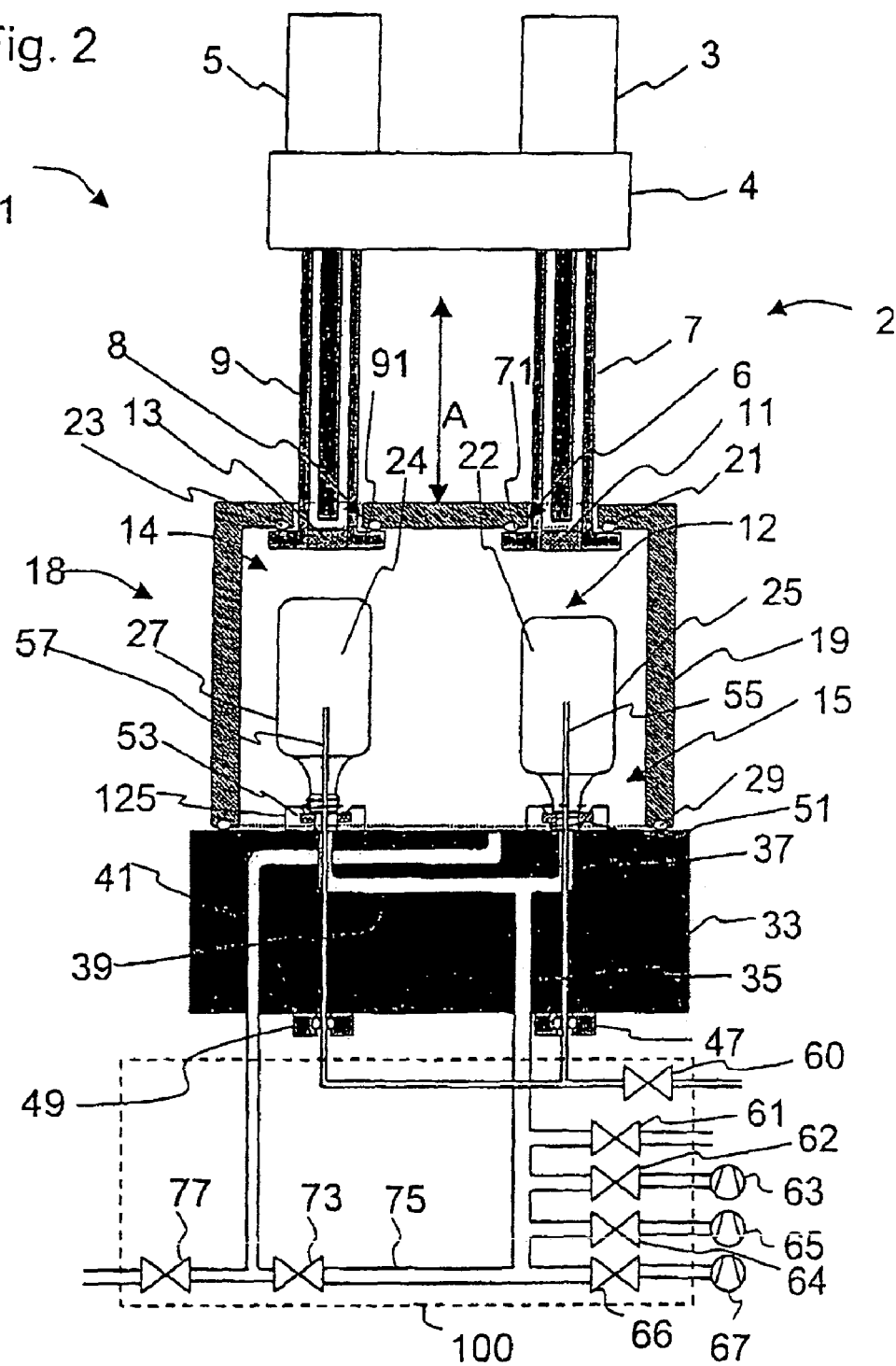
FIG. 2 shows a further variant of the embodiment shown in FIG. 1A with a common coating chamber for two coating places.

FIG. 2 illustrates a variant of the embodiment shown in FIG. 1. In this variant, unlike in the embodiment described with reference to FIG. 1, there is a common coating chamber 15 for two coating places 12 and 14. For this purpose, the sleeve part 19 does not have two separate sleeves, as in the exemplary embodiment described above, but rather one common sleeve which fits over both workpieces or over both coating places when it is closed. Accordingly, the coating apparatus also requires only one supply passage 41 for the evacuation and venting of the reactor chamber or coating chamber 15.

Figure 3:
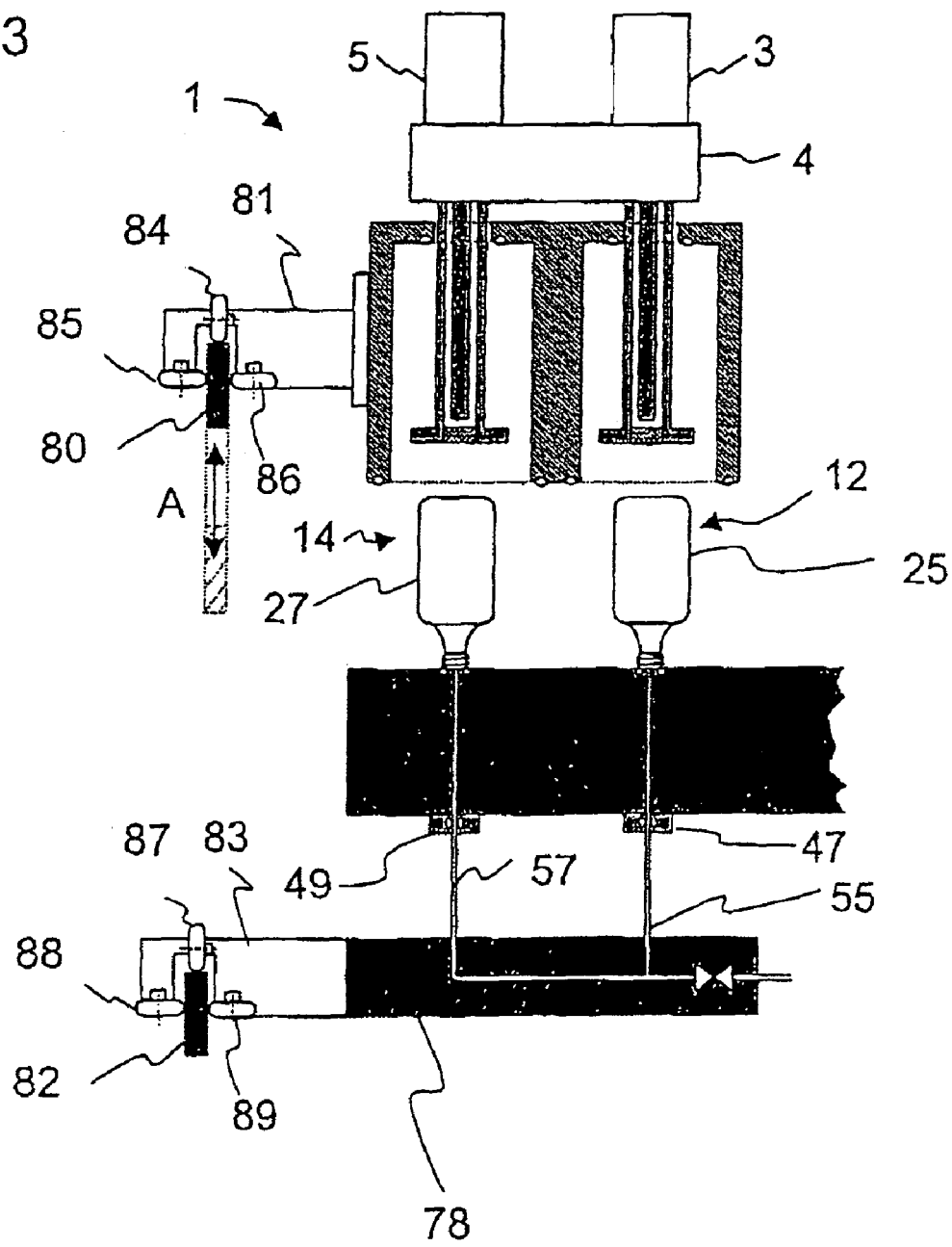
FIG. 3 shows a cross-sectional view through an embodiment of the invention with the opening and closing operation controlled by mechanical control cams.

FIG. 3 illustrates a cross-sectional view through an embodiment of the invention in which the opening and closing of the coating chambers is effected by mechanical control cams. For the sake of clarity, the feed passages and the pumps and control valves are not illustrated in FIG. 3.

There is an arm 81 at the sleeve part 19 of the coating apparatus 1. Cam rollers 84, 85 and 86 are arranged at the arm 81. The cam rollers 84, 85 and 86 engage around a mechanical control cam 80 past which the coating apparatus 1 is moved in the conveying direction. The control cam 80 likewise extends along the conveying direction and is suitably curved, so that its cross-sectional profile extends along direction A. As a result, when the coating apparatus moves past the control cam, the arm and the sleeve part 19 connected to it likewise move along the direction A, with the result that the coating chambers are opened and closed in order for workpieces to be inserted into the coating places 12 and 14 or to be removed.

The movement of the gas lances 55 and 57 can be controlled in the same way. For this purpose, the gas lances are secured to a carrier 78, to which an arm 83 is also fitted. The arm 83 engage around a further mechanical control cam 82. The gas lances are moved in a similar way to that which has been described above with regard to the movement of the sleeve part 19. The passages in the base element 33, within which the gas lances 55 and 57 move, are sealed in a gas-tight manner with respect to atmosphere by dynamic seals 47 and 49 with a leak rate of <0.1 mbar l/s, so that within the scope of the leak rate it is impossible for any gas to enter the interior of the workpieces 25 and 27 in the form of hollow bodies from the environment. As an alternative to what is illustrated in FIG. 3, it is also possible to use non-dynamic seals 47, 49 which are secured to the gas lances 55, 57 and have an axial sealing ring, as described with reference to FIG. 1B.

Figure 4:
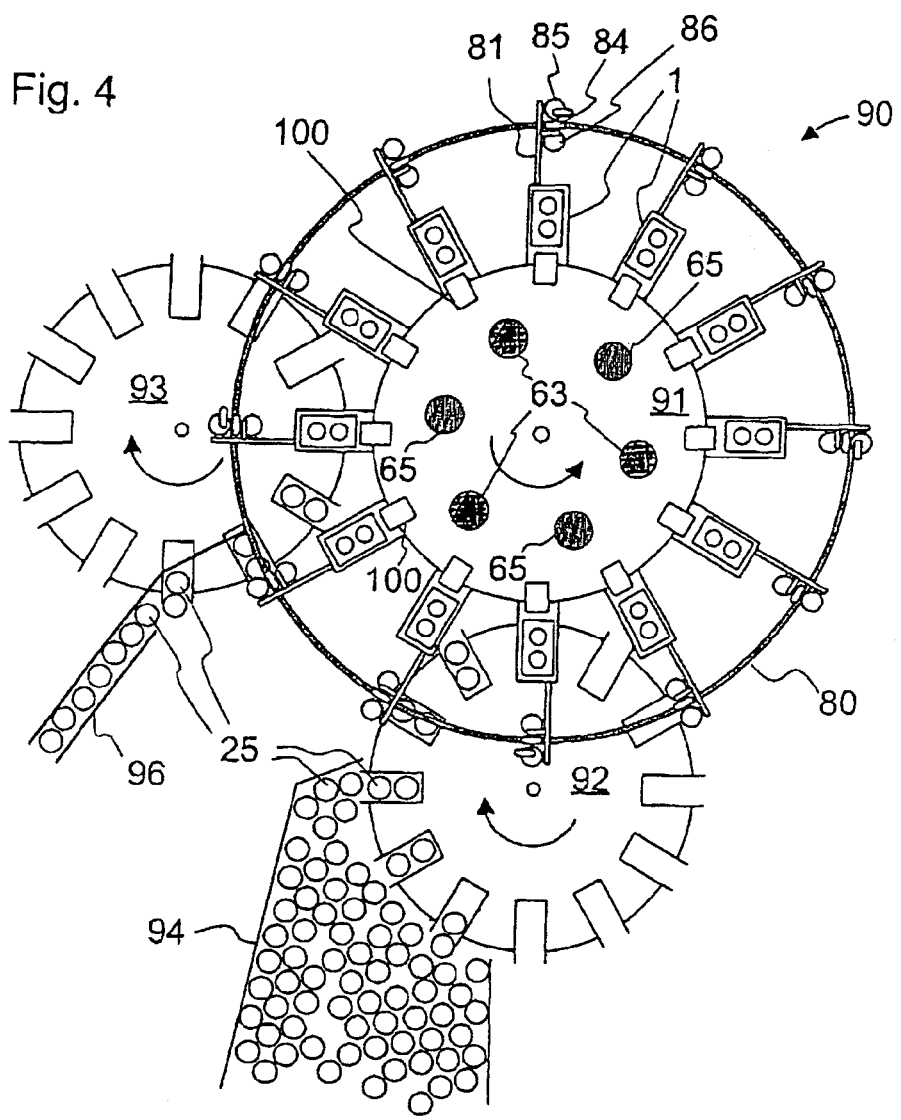
FIG. 4 shows a diagrammatic plan view of a coating installation having a multiplicity of coating apparatuses according to the invention.

FIG. 4 illustrates a diagrammatic plan view of a coating installation 90 for coating workpieces 25 which is equipped with a multiplicity of coating apparatuses 1 according to the invention. The coating installation 90 comprises a rotary conveyor device or a rotor 91, on which, by way of example, 12 of the coating apparatuses 1 according to the invention are arranged. Furthermore, the coating installation comprises a control cam 80 mounted in a fixed position for controlling the opening and closing operations of the coating device 1.

Moreover, the coating devices 1 each have arms 81 which, as has been illustrated with reference to FIG. 3, are secured to the respective sleeve parts of the reactors and are moved by being moved past the control cam 80.

The workpieces 25 are fed via a conveyor rail 94 to an allocation wheel or transfer wheel 92, which then transports the workpieces to the coating places of the coating apparatuses 1. The workpieces are then fixed in suitable receiving parts of the coating places of the coating apparatuses 1. When the rotor rotates, the sleeve parts are closed by being moved past the control cam 80 as described above, and the coating chambers of the reactors are evacuated. In the case of workpieces in the form of hollow bodies, it is then possible for gas lances to be introduced into the workpieces, likewise under the control of a control cam. Then, process gas is admitted and the coating is effected by the introduction of microwaves while the rotor 91 continues to rotate.

The supply of process gas, the venting and evacuation of the coating chambers of the coating apparatuses 1 is controlled by means of valve blocks 100 which, together with the coating apparatuses, are arranged on the rotor and rotate with it. In this embodiment of a coating installation 90, moreover, pump devices 63, 65 are also arranged on the rotor so as to rotate with it, and these pump devices are connected to the valve blocks 100 for supplying vacuum to the coating chambers via feed lines. In addition, there may also be one or more pump devices which are arranged in a fixed position and are connected to the valve blocks via a rotary feed.

An arrangement of this nature, with pump devices and valves which rotate with the rotor, as has been explained in principle with reference to FIG. 4, is also described in the German patent application bearing application number 102 53 512.4-45, the content of disclosure of which is hereby also incorporated in its entirety by reference in the subject matter of the present invention. After the treatment of the workpieces has ended, the sleeve parts of the coating apparatuses 1 are raised again by means of the control cam 80, and the chambers opened, after which the coated workpieces 25 are removed by a conveyor wheel 93 and fed to a transport rail 96 to be transported onward.

Figure 5:
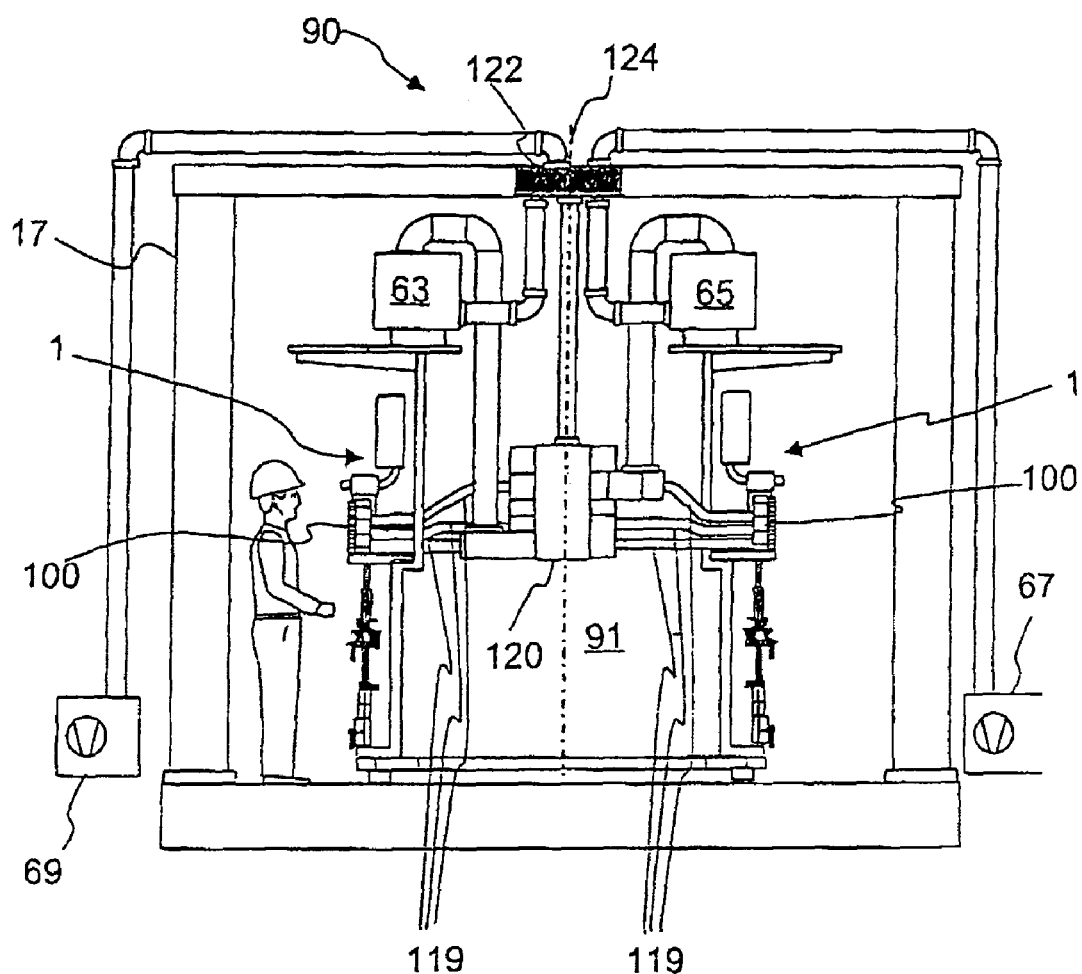
FIG. 5 and FIG. 6 show views of two exemplary embodiments of coating installations according to the invention with pump devices carried along by the conveyor device.
Figure 6:
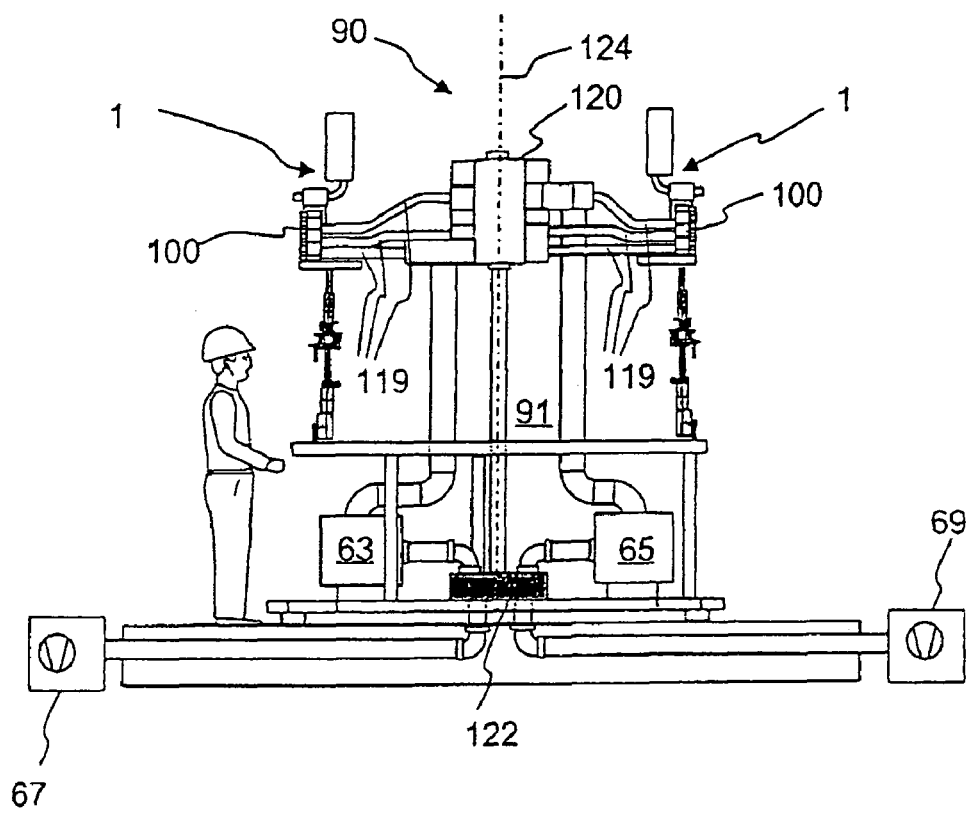

FIG. 5 and FIG. 6 illustrate views of two further exemplary embodiments of coating installations 90 according to the invention, in which pump devices 63, 65 are conveyed by the conveyor device. In these exemplary embodiments too, the conveyor device comprises a rotor 91 with coating apparatuses 1 arranged thereon. The valve blocks 100 are arranged in the vicinity of the coating apparatuses 1. The coating devices 1 are connected to pump devices 63, 65, 67, 69 via the valve blocks 100, the connection being effected via feed lines 119 from the valve block 100 to a ring distributor 120.

The pump devices 63 and 65 are arranged on the rotor 91 so as to rotate with it, whereas the further pump devices 67, 69 are disposed in a fixed position. The connection to the fixed pump devices 67, 69 is additionally effected via a rotary feed 122.

The two exemplary embodiments shown in FIGS. 5 and 6 differ with regard to the arrangement of rotary feed and pump devices. In the embodiment of a coating installation according to the invention shown in FIG. 5, the pump devices 63 and 65 which rotate with the rotor are arranged above the coating stations 1, and in the embodiment shown in FIG. 6 they are arranged beneath the coating stations 1. In both exemplary embodiments, the rotary feed 122 is arranged centrally on the axis of rotation 124, with the rotary feed 122 being arranged above the ring distributor 120 in the exemplary embodiment shown in FIG. 5 and below the ring distributor 120 in the exemplary embodiment shown in FIG. 6.

In these exemplary embodiments, the fixed pump devices 67, 69 serve as a preliminary stage to the pump devices which rotate with the rotor and for higher pressure ranges in the case of sequential evacuation of the coating chambers. The individual pump devices are sequentially switched on and off in order to evacuate and discharge process gas under the control of valves of the valve blocks 100.

Figure 7:
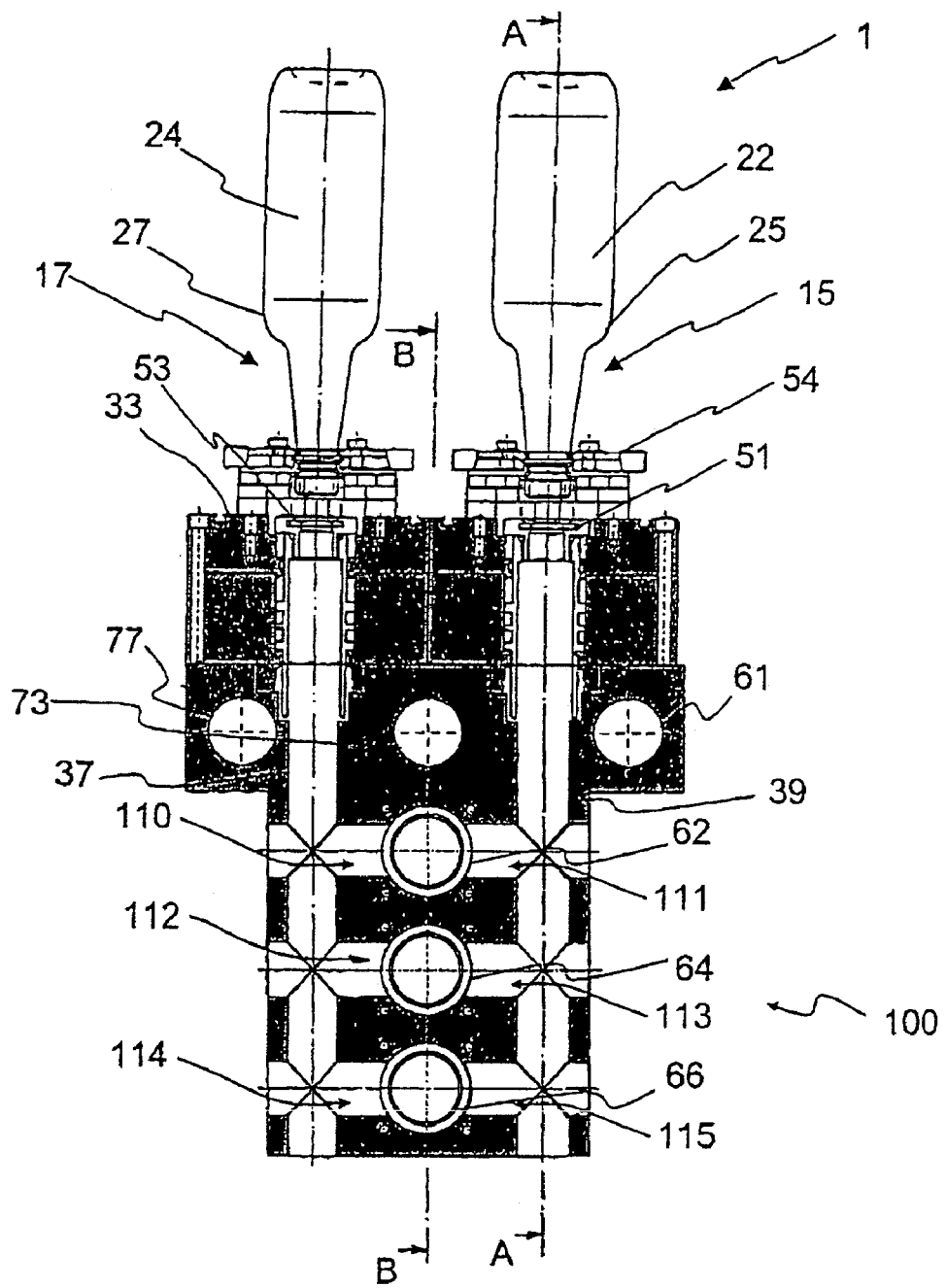
FIG. 7 shows a cross-sectional view of an embodiment of a valve block according to the invention for controlling the supply to the coating chambers.

FIG. 7 shows a cross-sectional view through an embodiment of a valve block 100 according to the invention for controlling the supply to the coating chambers 15, 17 of a coating apparatus 1 according to the invention or a coating installation having coating apparatuses 1 of this type. The sleeves of the coating apparatus 1 are not shown here, for the sake of clarity. The valves of the valve block are also only indicated diagrammatically.

The embodiment illustrated here is advantageous in particular for supplying two plasma or coating chambers 15, 17 with as far as possible a symmetrical configuration of the respective feed passages or supply passages. In a region of the valve block 100 which faces the coating chambers, the valve 73, the workpiece vent valve 61 and the chamber vent valve 77 are arranged on a substantially identical vertical plane. The primary vacuum valve 66, the secondary vacuum valve 64 and the process vacuum valve 62 are arranged beneath this plane and in a vertical direction beneath one another.

The valve block 100 illustrated in FIG. 7 is intended to supply a coating apparatus 1 having base element 33 and moveable sleeve part and having two coating chambers 15, 17, as shown, for example, in FIG. 1A. A correspondingly designed valve block 100, which is arranged on the conveyor device of a coating installation 90, may, however, also be used for other types of coating apparatuses conveyed by the conveyor device. In general, for this purpose a suitable coating apparatus has a reactor which comprises at least two chamber parts, at least one of which chamber parts is moveable, with at least one sealed coating chamber being formed between the chamber parts in the fitted-together position of the parts.

The coating apparatus 1, which is not illustrated in full in FIG. 7, is connected, via the valve block 100, to at least two feed lines in order to supply the coating chambers 15, 17 with vacuum and process gas.

Unlike what is illustrated in FIGS. 1A, 1B and 2, the supply passages 37, 39 for the inner region of both coating places do not open out into a common supply passage 35 for the interiors 22, 24 of the workpieces. Rather, in this case the supply passages 37, 39 are connected, via branches 110-115 in the valve block 100, to the valves 62, 64, 66, which for their part are connected to feed lines (not shown) to pump devices 63, 65, 67.

Moreover, in the case of the valve block 100 illustrated in FIG. 7, the supply passages 37 and 39 of the chambers are in each case assigned to common valves 62, 64, 66, so that the two coating chambers 15, 17 are supplied jointly via these valves. It is also possible for the valves for supplying process gas and for venting each to be assigned to both coating chambers. As a result, at least one of the steps of evacuating the area surrounding a surface of the workpieces which is to be coated in the coating chambers 15, 17 or of supplying process gas to the coating chambers 15, 17 can take place via common valves 62, 64, 66 of the valve block 100.

The supply passages 37, 39 and branches 110-115 are, moreover, arranged symmetrically with respect to the valves 62, 64, 66. This results in identical conductances of the supply passages for both coating chambers 15, 17, so that pressure differences between the two chambers 15, 17 are largely avoided.

In the embodiment of the invention illustrated in FIG. 7, the workpieces 25, 27 in the form of hollow bodies are also held by holding elements 54, and to seal the interiors 22, 24 seals 51, 53 are pressed onto the mouth openings of the workpieces 25, 27 by pistons.

The sectional illustration means that not all the valves of the valve block can be seen in FIG. 7.

Figure 8:
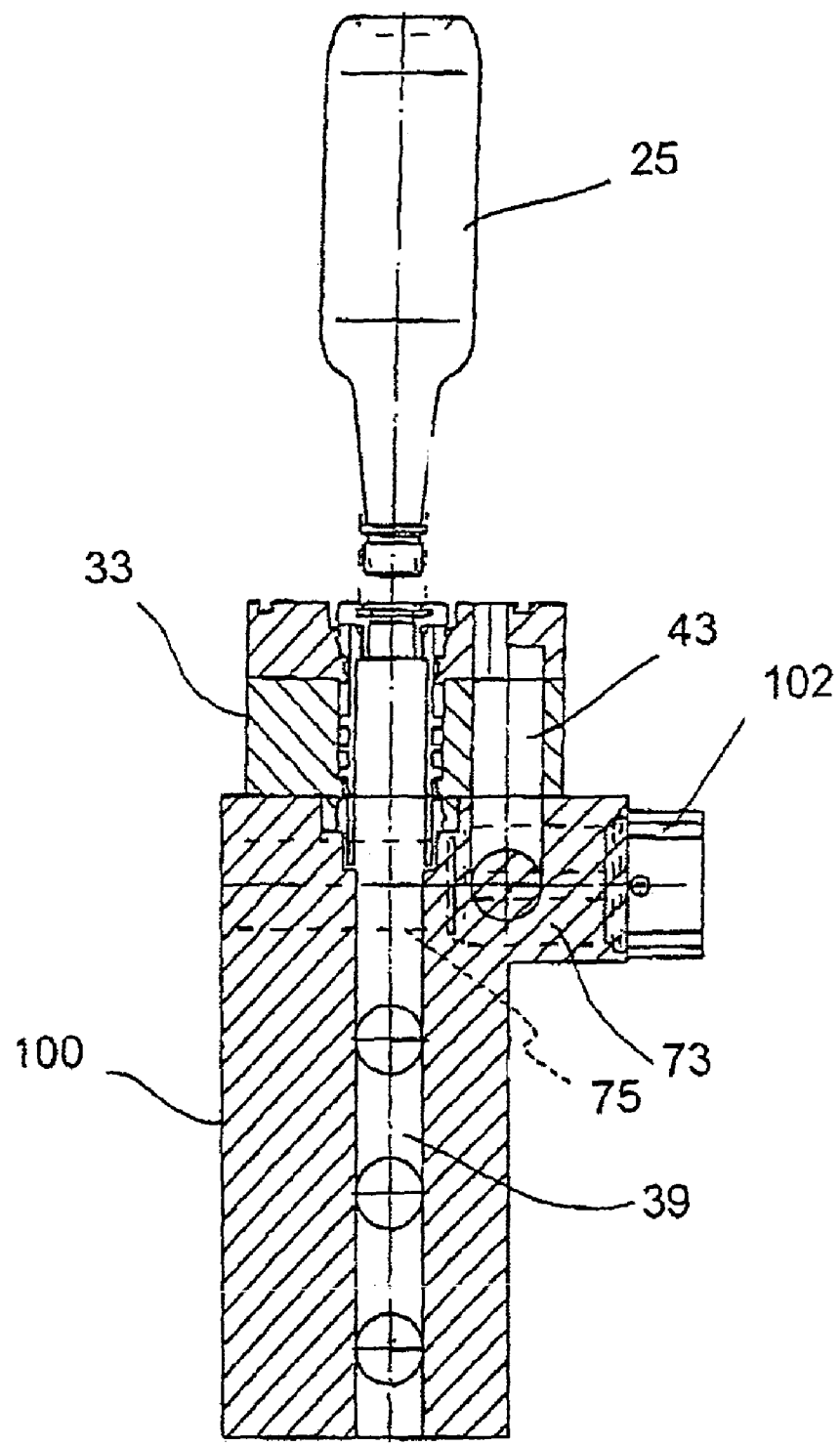
FIG. 8 shows a section on section line A-A in FIG. 7 perpendicular to the section plane illustrated in FIG. 7.

As a complementary measure, FIG. 8 shows a section on section line A-A in FIG. 7, perpendicular to the section plane illustrated in FIG. 7. The holding elements 54 are not illustrated in FIG. 8, for the sake of simplicity. FIG. 8 shows the valve 73 which is connected to the supply passage 39 via a bypass line 75. The valve 73 connects the bypass line 75 to the supply passage 43. A valve drive or actuating element 102, which drives the valve 73 so as to switch it, can also be seen. According to one embodiment of the invention, the drive element is designed as a pneumatic drive. The pneumatic drives of a plurality of valves can in this case be controlled by means of a pneumatic distributor (not shown).

By opening the valve 73, it is also possible, if one of the valves 62, 64, 66 is opened simultaneously, to evacuate the area surrounding the workpieces 25, 27 in the coating chambers.

Figure 9:
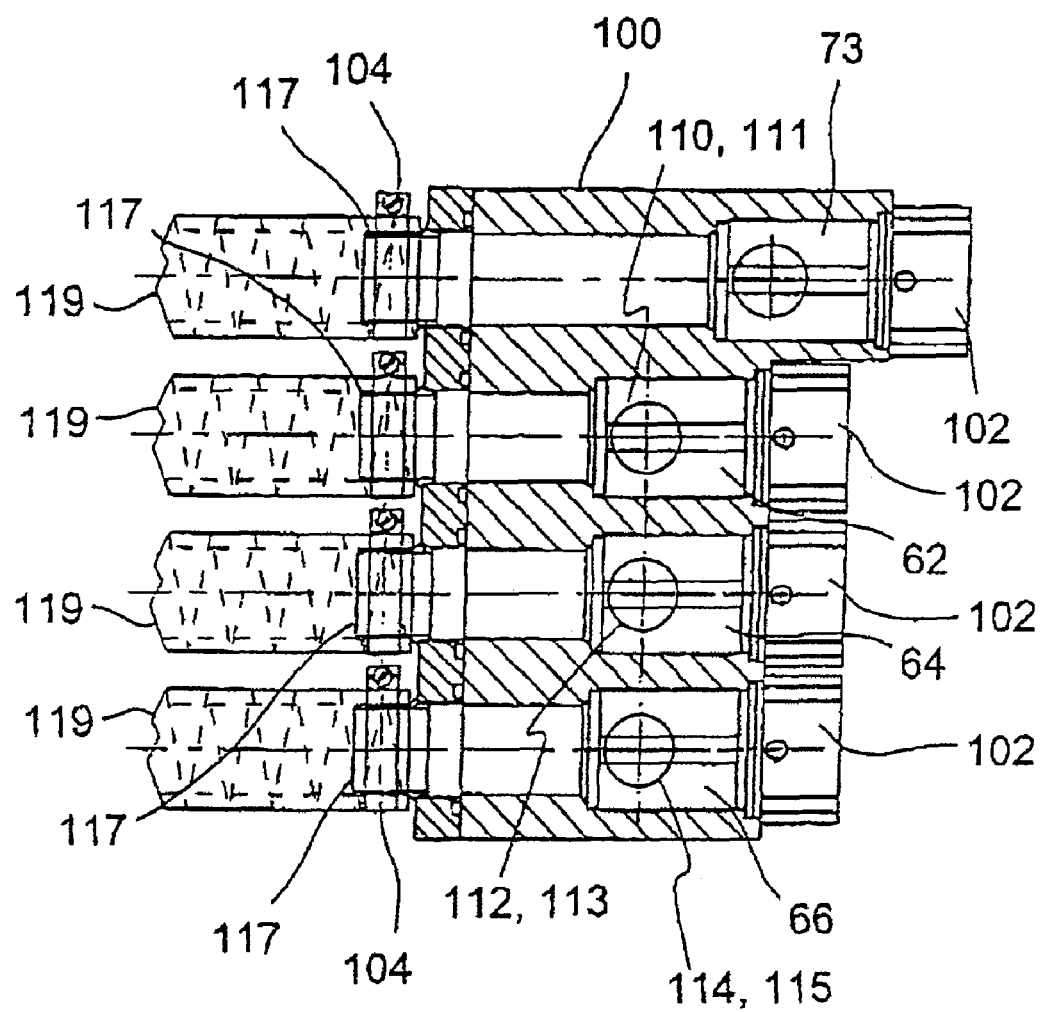
FIG. 9 shows a section on section line B-B in FIG. 7 perpendicular to the section plane illustrated in FIG. 7, and FIGS. 10A and 10B show a sectional view and a plan view of a sealing flange of a coating apparatus for workpieces in the form of hollow bodies.

FIG. 9 shows a section on section line B-B in FIG. 7, perpendicular to the section plane illustrated in FIG. 7.

The coating chambers are connected, via the valve block 100, to feed lines 119, via which vacuum and process gas are supplied to the coating chambers. The feed lines 119 are connected to connection pieces 117 on the valve block 100 and are fixed using hose clips 104. According to the present exemplary embodiment, connecting lines in the form of flexible hoses are provided as feed lines 119. It is also possible for connection pipes to be used as feed lines 119.

The invention claimed is:

1. A coating apparatus for the plasma coating of workpieces, comprising:
   a reactor having a moveable sleeve part and a stationary base element which can be brought into contact with each other by moving the moveable sleeve part, the moveable sleeve part and the stationary base element forming at least one sealed coating chamber that can be evacuated when fitted together and that allows for an exchange of the workpieces when separated;
   at least one opening being defined in the moveable sleeve part;
   a supply conductor moveably engaged with the at least one opening, the supply conductor being configured to introduce electromagnetic energy into the at least one sealed coating chamber, wherein the reactor has at least two coating places, and wherein the moveable sleeve part is moveable along the supply conductor so that the supply conductor serves as guide for the movable sleeve part during fitting together and separating of the movable sleeve part from the at least one coating chamber; and
   a guide for a substantially perpendicular movement of the moveable sleeve part with respect to the base element in order to open and close the at least one sealed coating chamber.

2. The coating apparatus as claimed in claim 1, wherein the base element has supply passages for evacuating and/or venting and/or supplying process gas.

3. A coating apparatus for the plasma coating of workpieces, comprising:
   a reactor having a moveable sleeve part and a stationary base element which can be brought into contact with each other by moving the moveable sleeve part, the moveable sleeve part and the stationary base element forming at least one sealed coating chamber that can be evacuated when fitted together and that allows for an exchange of the workpieces when separated;
   at least one opening being defined in the moveable sleeve part; and
   a supply conductor moveably engaged with the at least one opening, the supply conductor being configured to introduce electromagnetic energy into the at least one sealed coating chamber, wherein the reactor has at least two coating places, and wherein the moveable sleeve part is moveable along the supply conductor so that the supply conductor serves as guide for the movable sleeve part during fitting together and separating of the movable sleeve part from the at least one coating chamber, wherein the at least one sealed coating chamber comprises at least two separate coating chambers being formed between the moveable sleeve part and the base element.

4. The coating apparatus as claimed in claim 1, wherein the at least one sealed coating chamber defines a common coating chamber for at least two coating places.

5. The coating apparatus as claimed in claim 1, wherein the supply conductor comprises a waveguide and/or a coaxial conductor.

6. The coating apparatus as claimed in claim 1, wherein the supply conductor comprises at least one device for generating electromagnetic energy.

7. The coating apparatus as claimed in claim 6, wherein the at least one device for generating electromagnetic energy comprises at least one microwave head.

8. The coating apparatus as claimed in claim 1, wherein the supply conductor further comprises at least one device for distributing the electromagnetic energy.

9. The coating apparatus as claimed in claim 6, wherein the supply conductor comprises a device for generating pulsed electromagnetic energy.

10. The coating apparatus as claimed in claim 1, wherein the at least two coating places are designed to receive workpieces in the form of hollow bodies.

11. A coating apparatus for the plasma coating of workpieces, comprising:
    a reactor having a moveable sleeve part and a stationary base element which can be brought into contact with each other by moving the moveable sleeve part, the moveable sleeve part and the stationary base element forming at least one sealed coating chamber that can be evacuated when fitted together and that allows for an exchange of the workpieces when separated;
    at least one opening being defined in the moveable sleeve part; and
    a supply conductor moveably engaged with the at least one opening, the supply conductor being configured to introduce electromagnetic energy into the at least one sealed coating chamber, wherein the reactor has at least two coating places, and wherein the moveable sleeve part is moveable along the supply conductor so that the supply conductor serves as guide for the movable sleeve part during fitting together and separating of the movable sleeve part from the at least one coating chamber,
wherein the at least two coating places are designed to receive workpieces in the form of hollow bodies, and
wherein the at least two coating places have seals for sealing off the interior of the hollow bodies.

12. The coating apparatus as claimed in claim 10, wherein the base element has separate supply passages for evacuating and/or venting and/or supplying a process gas for an interior of and an area surrounding an exterior of the hollow bodies.

13. The coating apparatus as claimed in claim 12, wherein the supply passages of the at least two coating places are connected to one another via common supply lines.

14. The coating apparatus as claimed in claim 12, wherein the process gas is supplied by at least one gas lance.

15. The coating apparatus as claimed in claim 1, wherein the movement for opening and closing the moveable sleeve part is imparted via a mechanical control cam.

16. The coating apparatus as claimed in claim 1, wherein the base element has a fixed vertical position.

17. A coating apparatus for the plasma coating of workpieces, comprising:
a sleeve part defining at least a first coating place and a second coating place;
a first electromagnetic supply conductor having a first seal collar with a first seal, the first seal being arranged between the first seal collar and an inner top surface of the first coating place;
a second electromagnetic supply conductor having a second seal collar with a second seal, the second seal being arranged between the second seal collar and an inner top surface of the second coating place;
a stationary base element;
a third seal arranged between the stationary base element and a bottom of the first coating place so that the first coating place can be evacuated; and
a fourth seal arranged between the stationary base element and a bottom of the second coating place so that the second coating place can be evacuated, wherein the sleeve part is moveable substantially perpendicular to the base element, the first electromagnetic supply conductor, and the second electromagnetic supply conductor so that the sleeve part is moved along and guided by the first and second electromagnetic supply conductors until the inner top surfaces of the first and second coating places are brought into contact with the first and second seals, respectively, and the bottoms of the first and second coating places are brought into contact with the third and fourth seals, respectively.

18. The coating apparatus as claimed in claim 17, wherein the base element has a fixed vertical position.

19. A coating apparatus for the plasma coating of workpieces, comprising:
a stationary base element;
a moveable sleeve part;
a first electromagnetic supply conductor having a first seal collar with a first seal, the first seal being arranged between the first seal collar and an inner top surface of the moveable sleeve part;
a third seal arranged between the stationary base element and a bottom of the moveable sleeve part so that a first coating place defined by the stationary base element and the moveable sleeve part can be evacuated; and
wherein the moveable sleeve part moves along and is guided by the first electromagnetic supply conductor until the inner top surface of the moveable sleeve part is brought into contact with the first seal and the bottom of the moveable sleeve part is brought into contact with the third seal.

20. The coating apparatus as claimed in claim 19, further comprising:
a second electromagnetic supply conductor having a second seal collar with a second seal, the second seal being arranged between the second seal collar and the inner top surface of the moveable sleeve part; and
a fourth seal arranged between the stationary base element and the bottom of the moveable sleeve part so that a second coating place defined by the stationary base element and the moveable sleeve part can be evacuated, wherein the moveable sleeve part moves along and is guided by the first and second supply electromagnetic conductors until the inner top surface of the moveable sleeve part is brought into contact with the first and second seals, respectively, and the bottom of the moveable sleeve part is brought into contact with the third and fourth seals, respectively.

* * * * *